United States Patent
Wei et al.

(10) Patent No.: US 9,091,742 B2
(45) Date of Patent: Jul. 28, 2015

(54) FAULT IDENTIFICATION TECHNIQUES FOR HIGH RESISTANCE GROUNDED SYSTEMS

(75) Inventors: Lixiang Wei, Whitefish Bay, WI (US); Zhijun Liu, Menomonee Falls, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 639 days.

(21) Appl. No.: 13/400,537

(22) Filed: Feb. 20, 2012

(65) Prior Publication Data

US 2013/0218491 A1 Aug. 22, 2013

(51) Int. Cl.
*G01R 31/00* (2006.01)
*G01R 31/42* (2006.01)
*G01R 31/02* (2006.01)

(52) U.S. Cl.
CPC .............. *G01R 31/42* (2013.01); *G01R 31/025* (2013.01)

(58) Field of Classification Search
CPC .................................. G01R 1/00; G01R 31/00

USPC ................................................... 324/503, 509
See application file for complete search history.

(56) References Cited

U.S. PATENT DOCUMENTS

2004/0130326 A1* 7/2004 Yamamoto .................... 324/503
2011/0004429 A1* 1/2011 Morita et al. .................... 702/63

* cited by examiner

*Primary Examiner* — Vincent Q Nguyen
(74) *Attorney, Agent, or Firm* — Fletcher Yoder P.C.

(57) ABSTRACT

The present techniques include methods and systems for detecting a high resistive ground fault condition in an HRG system. Embodiments include systems and methods of measuring drive voltages and detecting voltage changes in the drive once the drive is in operation, particularly for drives operating at relatively low voltages and frequencies. In some embodiments, an integrator is utilized to detect peaks in the measured voltage changes. Relatively small ground currents are also measured to determine HRG faults. Moreover, in some embodiments, the detection of an HRG fault for one of several motor drives provide indication for the particular motor drive in fault.

24 Claims, 5 Drawing Sheets

FAULT IDENTIFICATION TECHNIQUES FOR HIGH RESISTANCE GROUNDED SYSTEMS

BACKGROUND

The invention relates generally to the field of electrical drives. More particularly, the invention relates to techniques for detecting ground faults in a high resistance ground network system.

In the field of power electronic devices, a wide range of circuitry is known and currently available for converting, producing and applying power to loads. Depending upon the application, motor drive systems may include circuitry that converts incoming power from one form to another as needed by the load. In a typical drive system, for example, a rectifier converts alternating current (AC) power (such as from a utility grid or generator) to direct current (DC) power. Inverter circuitry can then convert the DC signal into an AC signal of a particular frequency desired for driving a motor at a particular speed. The inverter circuitry typically includes several high power switches, such as insulated-gate bipolar transistors (IGBTs), controlled by drive circuitry. Motor drive systems also often include power conditioning circuitry, including capacitors and/or inductors, which remove undesirable ripple currents on the DC bus.

Electronic drives may be used for a wide range of industrial applications, and the system configurations for such different applications and different mechanical functions may also vary greatly. In certain electrical systems, high resistance ground (HRG) configurations may be advantageous for the operation of the drive. An HRG system involves inserting a resistance between a neutral node and the ground of the input AC source of the system such that the system can operate under single ground faulted condition with a small non-destructive ground fault current. During the operation of the drive, ground faults may sometimes occur. For example, ground faults in an HRG system may result in high voltage levels in bus lines associated with the electrical drive and high voltage stresses in electrical drive components, which may eventually result in failures of the electrical drive or other system components. However, HRG faults are typically difficult to detect once a drive is in operation, as the small amount of fundamental frequency ground current is difficult to measure in the presence of high frequency electronic noise created by the drive, especially in larger electrical drives or during low output speed conditions.

Most conventional techniques for detecting ground faults on HRG networks are based on simplified impedance models for the transmission line. However, these techniques lack sufficient accuracy when applied to systems containing power converters. Some techniques involve adjusting fault detection processes for both high frequency and low frequency operating conditions of a drive in an HRG system. However, such techniques may also lack sufficient accuracy, as false triggers may be generated under different system configurations.

It may be advantageous to provide techniques for detecting presence and location of ground faults on HRG networks in power conversion circuits during and/or prior to operation of such systems.

BRIEF DESCRIPTION

The present invention relates generally to techniques for detecting HRG fault conditions in an HRG system. Embodiments include systems and methods of measuring drive voltages and detecting voltage changes in the drive once the drive is in operation. Embodiments address the relatively low voltages generated in low speed power system applications by using an integrator to detect peaks in the measured voltage changes. In some embodiments, relatively small ground currents may also be measured to determine HRG faults. Moreover, in some embodiments, the detection of an HRG fault for one of several motor drives may result in an indication of the particular motor drive in fault.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present invention relates generally to techniques for detecting a ground fault condition in an electrical drive system having a high resistance ground (HRG) configuration. Embodiments include systems and methods of measuring drive voltages and detecting voltage changes in the drive once the drive is in operation. Embodiments address the relatively low voltages generated in low speed power system applications by using an integrator to detect peaks in the measured voltage changes. In some embodiments, relatively small ground currents may also be measured to determine HRG faults. Moreover, in some embodiments, the detection of an HRG fault for one of several motor drives may result in an indication of the particular motor drive in fault.

Figure 1:
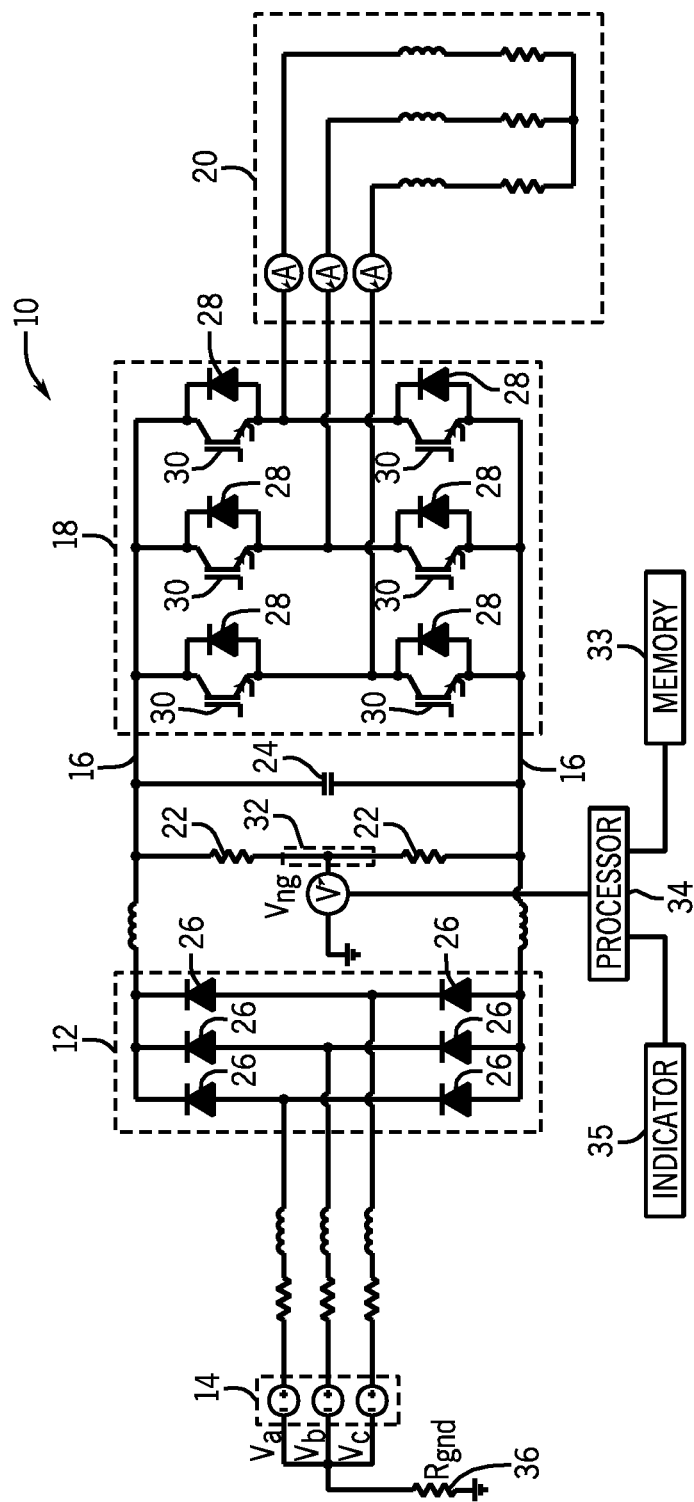
FIG. 1 is a circuit diagram of an application of an electrical drive system in a high resistance grounded (HRG) configuration, in accordance with an embodiment of the present techniques.

Turning to the figures, FIG. 1 depicts an exemplary application of a drive system 10 which may be used in various electrical systems. The drive system 10, also referred to as the drive 10, includes a converter 12 configured to receive an AC voltage from one or more power sources 14 and to convert the AC voltage to DC voltage applied to a DC bus 16. The drive 10 also includes an inverter 18, which receives the DC voltage through the DC bus 16 and converts DC voltage from the DC bus 16 to output AC voltage at any desired frequency. The drive 10 is configured to supply AC power to a load 20. In other embodiments, the drive 10 may supply power to any type of load 20 or motor, or some combination of a motor and a load 20, depending on the application for which the drive 10 is used. Depending on the electrical system in which the drive 10 is operating, different types of voltage may be supplied to the load 20. In one embodiment, the electrical drive system 10 also includes bus resistors 22 and capacitors 24 configured to filter harmonics associated with the DC bus 16 and/or filter the electrical switching noise generated by the drive system 10 through parasitic capacitances to ground.

In some embodiments, the converter 12 includes a 3×2 arrangement of thyristors 26 arranged in an integrated diode bridge configuration. The converter 12 may also be replaced with an arrangement of diodes, a rectifier bridge, or active control pulse width modulating (PWM) rectifiers that may be consistent with the 3×2 array of thyristors 26. The converter 12, also referred to as an rectifier 12, rectifies the incoming AC voltage to DC voltage in one direction to output a discretized output voltage waveform through the DC bus 16. The inverter 18 includes a 3×2 array of power diodes 28 and transistors 30, wherein each diode 28 is configured antiparallel to the respective transistor 30. The discretized output voltage from the DC bus 16 is switched by the transistors 30 which are configured to switch at a certain switching frequency to output voltages to the load 20. While the illustrated embodiment depicts three-phase voltages (e.g., $v_a$, $v_b$, $v_c$), it should be noted that in different embodiments, the drive 10 may be suitable for inputting and outputting voltages of different phases (e.g., single phase voltage, two-phase voltages). The configurations of the converter 12 and inverter 18 may also be different, depending on the operating voltage(s) of the drive 10.

In some embodiments, a neutral-to-ground voltage $V_{ng}$ is measured at node 32 (also referred to as a neutral-to-ground node) to determine various voltage, grounding, or other conditions of the drive 10. The node 32 is between the resistors 22 of the high side and low side of the DC bus 16 and a ground potential. In some embodiments, the measured $V_{ng}$ may be analyzed by a processor 34 that determines various conditions based on the measured $V_{ng}$. The processor 34 may be connected to memory 33 suitable for storing various data accessible by the processor for determining various conditions of the drive 10. In some embodiments, the processor 34 may also be connected to an indicator (e.g., a display, an alarm, etc.) for indicating various detected conditions of the drive 10. The drive 10 may be configured in a high resistance grounded (HRG) system suitable for withstanding approximately 1 A to 10 A ground current under a single ground fault condition. For example, the ground resistor 36 may have a resistance of approximately 27Ω to approximately 277Ω for a system operating at 480V.

Figure 2:
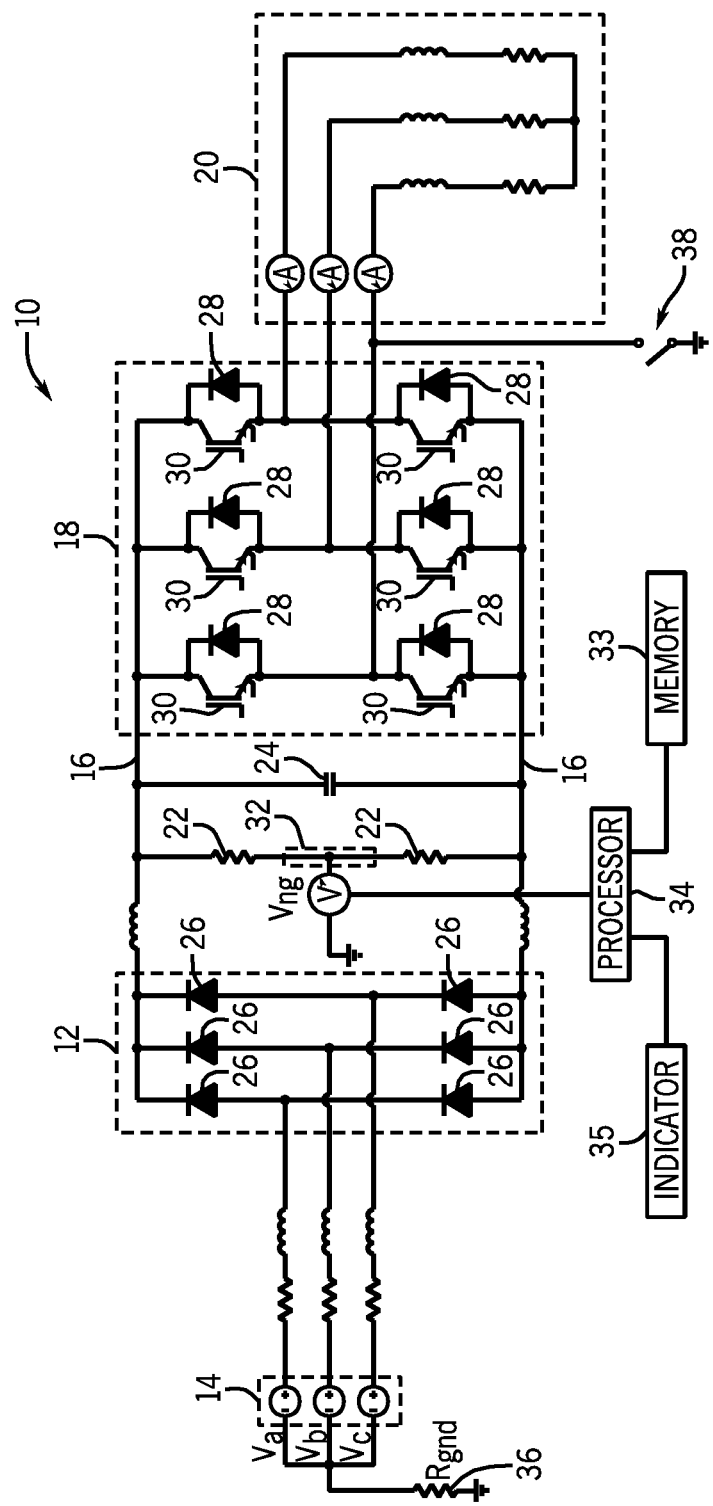
FIG. 2 is a circuit diagram of an HRG drive having a ground fault, in accordance with an embodiment of the present techniques.

One advantage of HRG systems is that an HRG configured drive may operate under ground fault conditions. A ground fault may refer to any short circuit or improper current flow between the drive 10 and ground. For instance, the drive 10a in FIG. 2 represents a ground fault 38 between one phase of the inverter output and ground. Although the drive 10a may still operate under with the ground fault 38, prolonged operation may result in stressing components of the drive 10a. For example, the generated ground current may result in high voltage levels in bus lines (e.g., DC bus 16) and high voltage stresses in the electrical drive components (e.g., the transistors 30) due to interaction of inverter 18 making and breaking the current into ground, which may eventually result in failures of the drive or failures in other components of the electrical system in which the drive is configured.

Though prolonged drive operation during ground fault conditions are undesirable, HRG faults are generally difficult to detect. Especially in larger drives, HRG faults typically generate a relatively small amount of ground current that may be difficult to measure. Typically, the ground current on the inverter side depends on the amplitude of the output phase voltage or the output frequency of the inverter output. Therefore, in drives 10 operating over an adjustable speed, the fundamental portion of the ground current may be lower than 1 A and may be difficult to detect. For instance, if the adjustable speed drive is operating at a relatively low speed, the ground current may be lower than a threshold level for detecting a fault condition. Therefore, an HRG fault may not be detected under such low frequencies.

Figure 3:
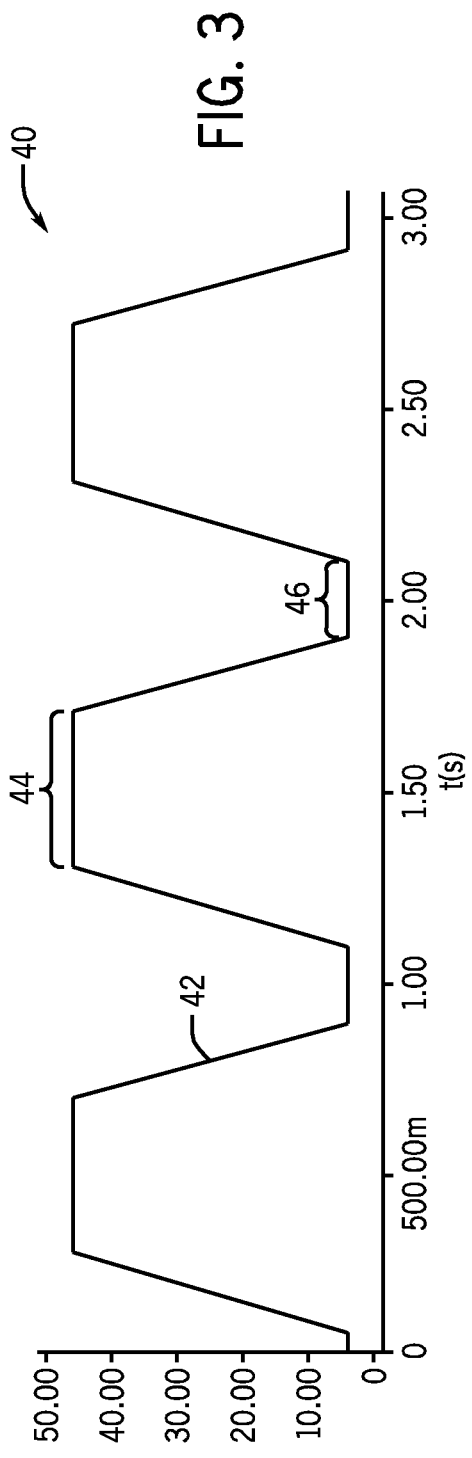
FIG. 3 is a graph depicting high speed and low speed operating frequencies of an inverter, in accordance with an embodiment of the present techniques.

FIG. 3 is a graph 40 representing an operating frequency 42 of an inverter 18 in a motor drive 10. In some embodiments, the operating frequency 42 of a motor drive 10 may be adjustable such that the drive 10 may be suitable for various applications or modes of applications. As illustrated in FIG. 3, the operating frequency 42 of the inverter may be adjusted between high operating frequency periods 44 and low operating frequency periods 46 at 45 Hz and 5 Hz, respectively.

Figure 4:
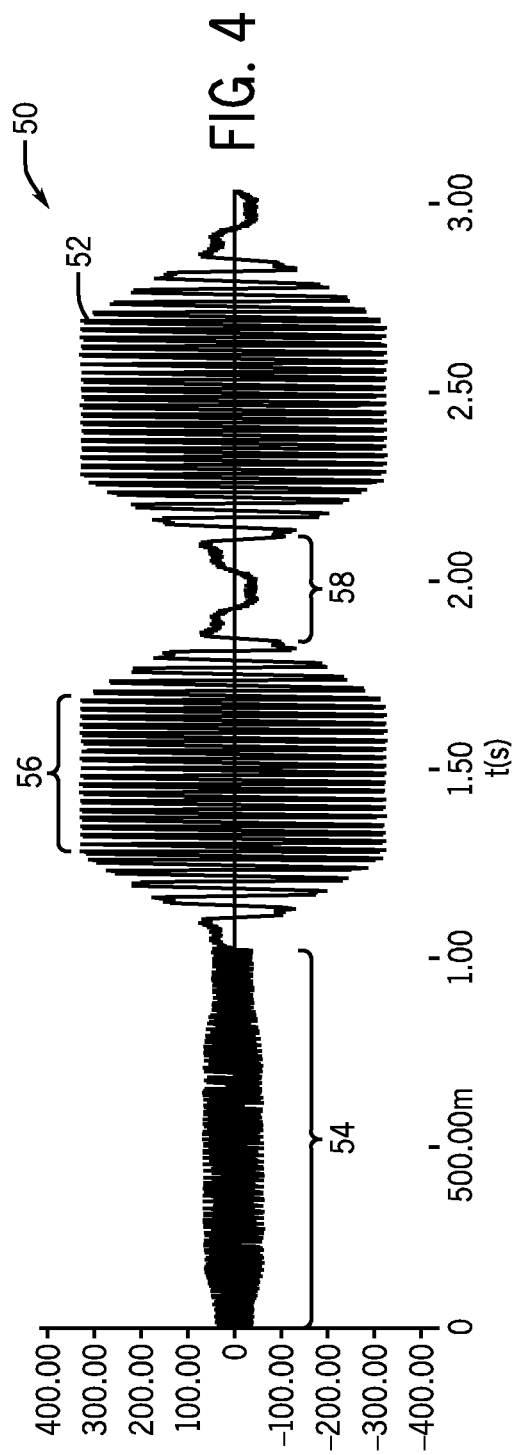
FIG. 4 is a graph depicting the neutral-to-ground voltage measured when an inverter is operating at high and low speed operating frequencies as illustrated in FIG. 3, in accordance with an embodiment of the present techniques.

In some embodiments, the neutral-to-ground voltage $V_{ng}$ is measured at a neutral-to-ground node (e.g., node 32 in FIGS. 1 and 2) to determine whether the drive 10 is operating in a ground fault condition. The measured $V_{ng}$ may be processed and analyzed (e.g., by a processor 34) to determine whether the measured $V_{ng}$ has fallen beyond a fault voltage threshold. The graph 50 of FIG. 4 represents the neutral-to-ground voltage $V_{ng}$ 52 which corresponds to the frequency output graph 40 of FIG. 3. The $V_{ng}$ 52 illustrated in FIG. 4 refers to a signal that may have been filtered to remove ripples caused by the PWM rectifiers of the converter 12. A non-fault period 54 during the first second illustrated in the graph 50 may have a relatively low voltage (e.g., under 100 V). This relatively low voltage may be substantially consistent during high and low frequency periods 44 and 46.

The $V_{ng}$ 52 may change during a fault condition, but the amplitude of $V_{ng}$ 52 during a fault condition may vary depending on the operating frequency 42 of the inverter 18. During high operating frequency periods 44 of the inverter 18, the $V_{ng}$ 52 may be substantially higher, as illustrated during the high frequency fault period 56 of the graph 50. However, during low operating frequency periods 46, the $V_{ng}$ 52 may be substantially lower, as illustrated during the low frequency fault period 58 of the graph 50. Therefore, while a high frequency fault period 56 may be reasonably detectable (e.g., by comparison with a threshold above the non-fault period 54), a low frequency fault period 58 may be less detectable. For instance, if a threshold is set to 80 V or to a voltage level just over the $V_{ng}$ 52 during a non-fault period 54, a fault condition during a low frequency fault period 58 may not be easily detected.

Figure 5:
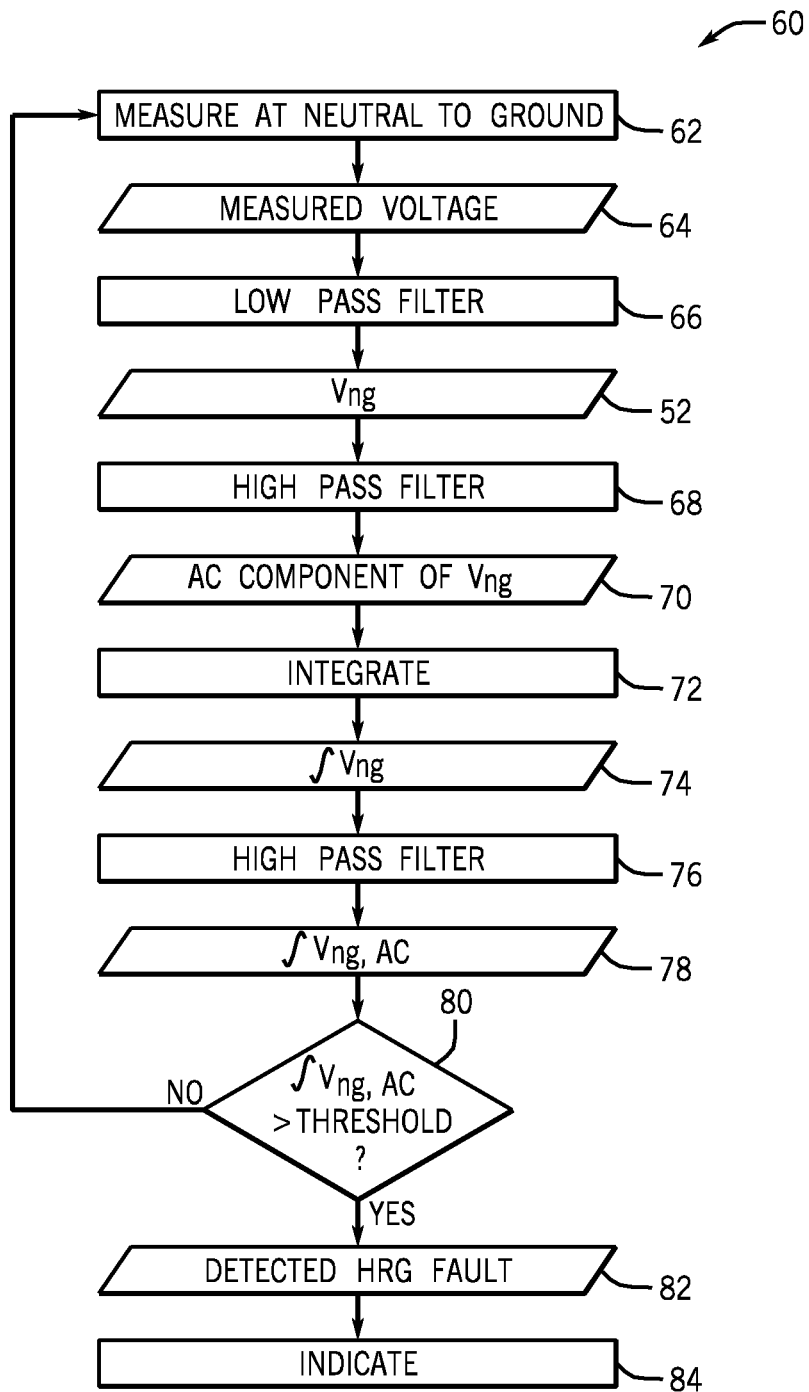
FIG. 5 is a flow chart of a method for identifying ground faults in an HRG drive system, in accordance with an embodiment of the present techniques.

Embodiments of the present invention include systems and methods for detecting an HRG ground fault in an HRG system. One embodiment of the present techniques is represented by the flow chart of FIG. 5. The process 60 represented in FIG. 5 may be suitable for detecting an HRG fault even when the inverter 18 is operating at relatively lower frequencies. However, the process 60 is not limited to fault detection during low frequency operation. It should be noted that the present techniques may be applied to fault detection for drives operating in high or low frequencies. Moreover, while the present techniques for detecting ground fault in high resistance ground network are described in connection with a motor drive, the techniques are not limited to such applications. Rather, the same methodology may be utilized for detecting ground faults in a wide range of circuit applications, particularly those in which a DC bus is used in conjunction with AC/DC rectification, or more generally conversion circuitry, and DC/AC conversion circuitry.

The process 60 may begin with measuring (block 62) the voltage at neutral-to-ground node (e.g., node 32 from FIGS. 1 and 2). The measured voltage 64 may then be low pass filtered (block 66) to remove ripples caused by the PWM rectifiers of the converter 12. In some embodiments, the low pass filter may be approximately 450 Hz or a suitable frequency for filtering out ripples which may undesirably interfere with the processing of the signal and/or the detection of a fault condition. Further, in some embodiments, two or more low pass filters (e.g., two filters at 450 Hz) may be implemented to filter the measured voltage 64. The low pass filtered voltage is referred to as the neutral to ground voltage $V_{ng}$ 52. In some embodiments, the $V_{ng}$ 52 may then be high pass filtered (block 68) to smooth the DC bias of the signal, resulting in a smoothed $V_{ng}$ 70. The high pass filtering (block 68) and other subsequent processing steps may be performed by a suitable processor, such as the processor 34 in FIGS. 1 and 2. The smoothed $V_{ng}$ signal 70 may then be integrated (block 72) to result in the integrated $V_{ng}$ 74. In some embodiments, the integrated $V_{ng}$ 74 may be high pass filtered (block 76) once more to result in the AC component of the integrated $V_{ng}$ 78.

Figure 6:
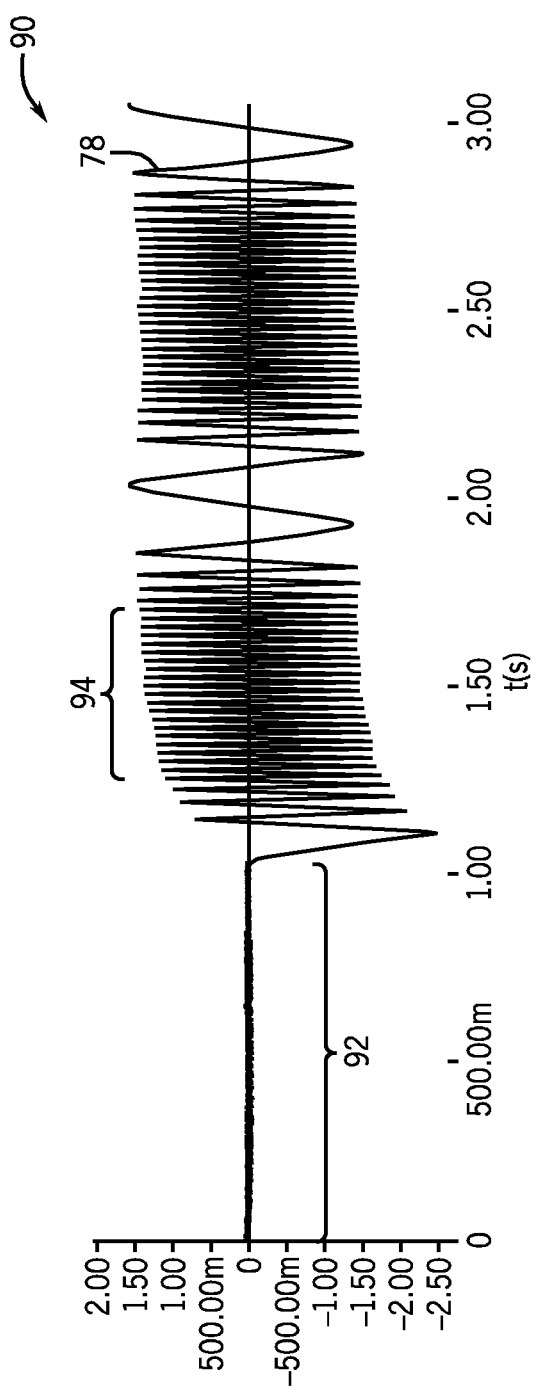
FIG. 6 is a plot representing a voltage condition using the method of FIG. 5, in accordance with an embodiment of the present techniques.

An example of the integrated $V_{ng}$ 78 which corresponds to the operating frequency graph 40 of FIG. 3 and $V_{ng}$ graph 50 of FIG. 4 is illustrated in the graph 90 of FIG. 6. The integrated $V_{ng}$ 78 may have substantially zero amplitude during a non-fault period 92. However, the integrated $V_{ng}$ 78 may have relatively the same amplitude during a fault period 94 when the inverter 18 is operating at high frequencies as during a fault period 96 when the inverter 18 is operating at low frequencies. While the fault period 58 of $V_{ng}$ 52 without integration may have been too low to differentiate from a non-fault period 53, the integrated $V_{ng}$ 78 may result in a more identifiable fault whether the drive inverter 18 is operating at high or low frequencies.

Therefore, and referring back to FIG. 5, the amplitude of the integrated $V_{ng}$ 78 may be compared with a threshold voltage level indicative of a fault condition. In some embodiments, the processor 34 may determine (block 80) when the integrated $V_{ng}$ 78 surpasses a threshold. The threshold may be a maximum voltage level, above which indicates that the drive 10 is operating in a fault condition. The threshold may be set for a particular motor drive 10 or may vary based on different motor drive configurations, system configurations, drive applications, operating parameters, etc. If the integrated $V_{ng}$ 78 is greater than the threshold, the processor 34 may determine that an HRG fault 82 is detected. In some embodiments, the processor 34 may indicate (block 84) the detected HRG fault 82. For example, the processor 34 may communicate with an indicator 35 (FIGS. 1 and 2), such as a display, an alarm, a light, or other alert to indicate the detection of an HRG fault 82. In some embodiments, in systems with multiple motor drives 10, a suitable processor may indicate 84 which motor drive is in fault, such that an operator of the system may attend the particular drive that is in fault.

Furthermore, in some embodiments, different thresholds may be appropriate for different operating conditions of the drive 10 or for various systems in which the drive 10 is configured. In different embodiments, the drive 10 or a system may include a memory 33 suitable for storing the different thresholds, and the processor 34 may access the memory 33 for different thresholds or instructions to determine a condition of the drive 10. In some embodiments, the processor 34 may also store various detected conditions in the memory 33 which may be accessed by an operator via the display 35.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for detection of a ground fault in a high resistance grounded (HRG) system, comprising:
    measuring a neutral-to-ground voltage at a node between a neutral node and a ground potential in a motor drive while the motor drive is coupled to an electrical system, wherein the neutral node is coupled to both a high side of a DC bus and a low side of the DC bus in parallel with a rectifier circuit, wherein the motor drive comprises a power converter configured to convert AC power to DC power applied to the DC bus and an inverter configured to convert DC power from the DC bus to output AC power;
    filtering the neutral-to-ground voltage to result in an filtered voltage; and
    detecting a presence of the ground fault in the HRG system based on the filtered neutral-to-ground voltage.

2. The method of claim 1, comprising low pass filtering the neutral-to-ground voltage.

3. The method of claim 1, comprising high pass filtering the neutral-to-ground voltage.

4. The method of claim 1, comprising removing ripples from the neutral-to-ground voltage.

5. The method of claim 1, comprising smoothing a DC bias of the neutral-to-ground voltage.

6. The method of claim 1, comprising high pass filtering the filtered voltage.

7. The method of claim 1, comprising removing a DC bias of the filtered voltage.

8. The method of claim 1, wherein detecting the presence of the ground fault comprises comparing an amplitude of the filtered voltage with a threshold.

9. The method of claim 8, wherein the ground fault is detected when the amplitude of the filtered voltage is greater than the threshold.

10. The method of claim 1, comprising indicating when the ground fault is detected.

11. The method of claim 10, wherein indicating when the ground fault is detected comprises indicating which drive is operating during the ground fault in an HRG system comprising a plurality of drives.

12. A method for detection of a ground fault in a high resistance grounded (HRG) system, comprising:
    detecting a neutral-to-ground voltage between a neutral node and a ground potential in a motor drive while the motor drive is coupled to an electrical system, wherein the motor drive comprises a rectifier circuit that provides power to a DC bus, and an inverter coupled to the DC bus to convert DC power from the DC bus to output AC power, and wherein the neutral node is coupled to both a high side and a low side of the DC bus in parallel with the rectifier circuit;
    integrating the neutral-to-ground voltage to result in an integrated voltage; and
    detecting a presence of the ground fault in the HRG system based on the integrated neutral-to-ground voltage.

13. The method of claim 12, comprising low pass filtering the neutral-to-ground voltage.

14. The method of claim 12, comprising high pass filtering the neutral-to-ground voltage.

15. The method of claim 12, comprising removing ripples from the neutral-to-ground voltage.

16. The method of claim 12, comprising smoothing a DC bias of the neutral-to-ground voltage.

17. The method of claim 12, wherein detecting the presence of the ground fault comprises comparing an amplitude of the integrated voltage with a threshold.

18. The method of claim 17, wherein the ground fault is detected when the amplitude of the integrated voltage is greater than the threshold.

19. The method of claim 12, comprising indicating when the ground fault is detected.

20. The method of claim 19, wherein indicating when the ground fault is detected comprises indicating which drive is operating during the ground fault in an HRG system comprising a plurality of drives.

21. A method for detection of a ground fault in a high resistance grounded (HRG) system, comprising:
   in an HRG system comprising a plurality of motor drives, measuring a neutral-to-ground voltage between a neutral node and a ground potential in the system while at least one motor drive is operating, wherein the neutral node is coupled to both a high side of a DC bus and a low side of the DC bus in parallel with a rectifier circuit, wherein each motor drive comprises an inverter configured to convert DC power from the DC bus to output AC power for driving a motor;
   filtering the neutral-to-ground voltage to result in an filtered voltage;
   detecting a presence of the ground fault in the HRG system based on the filtered neutral-to-ground voltage; and
   indicating when the ground fault is detected comprises indicating which drive is operating.

22. The method of claim 21, wherein detecting the presence of the ground fault comprises comparing an amplitude of the filtered voltage with a threshold.

23. The method of claim 21, wherein the ground fault is detected when the amplitude of the filtered voltage is greater than the threshold.

24. The method of claim 21, comprising low and high pass filtering the neutral-to-ground voltage.

* * * * *